(12) United States Patent
Morrill

(10) Patent No.: US 6,215,342 B1
(45) Date of Patent: Apr. 10, 2001

(54) POWER-ON RESET CIRCUIT FOR DUAL-SUPPLY SYSTEM

(75) Inventor: David P. Morrill, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/353,514

(22) Filed: Jul. 14, 1999

(51) Int. Cl.[7] .................................................. H03K 17/22
(52) U.S. Cl. ............................................. 327/143; 327/198
(58) Field of Search .................................. 327/142, 143, 327/198, 80, 81, 333

(56) References Cited

U.S. PATENT DOCUMENTS

| | | |
|---|---|---|
| 4,996,453 | 2/1991 | Zanders . |
| 5,602,502 * | 2/1997 | Jiang ..................................... 327/143 |
| 5,973,486 * | 10/1999 | Van Auken .......................... 327/143 |
| 6,078,201 * | 6/2000 | Crotty ................................... 327/143 |

* cited by examiner

Primary Examiner—Toan Tran
(74) Attorney, Agent, or Firm—Pierce Atwood; Chris A. Caseiro

(57) ABSTRACT

A power-on reset circuit for a dual-supply system. The reset circuit includes a voltage divider powered by the first power supply and a sub-circuit supplied by the second power supply. The output of the voltage divider is connected to a control node of the first reset sub-circuit that is otherwise powered by the second power supply. A second reset sub-circuit is strictly regulated and powered by the second power supply. The first reset sub-circuit provides for translation of a signal having a potential limited by the potential of the first supply into a signal having a potential associated with that of the second supply. Only when a control signal from the voltage divider reaches a certain potential, and the second power supply reaches a certain potential, is the first reset sub-circuit activated in a manner that results in a circuit output signaling both supplies are at a suitable potential. This is useful for hot insertion applications in dual-supply systems.

14 Claims, 3 Drawing Sheets

POWER-ON RESET CIRCUIT FOR DUAL-SUPPLY SYSTEM

BACKGROUND OF THE INVENTION

1. Field of the Invention

The present invention relates to circuitry for generating power-on reset signals for transmission to integrated circuit systems. In particular, the present invention relates to a power-on reset circuit that operates to hold off power-on reset until the high-potential power supply rail reaches a defined potential. More particularly, the present invention relates to power-on reset circuitry that operates as required when coupled to circuitry powered by supplies of differing potentials. The present invention is a power-on reset circuit used in association with logic level translation systems.

2. Description of the Prior Art

Power-on reset circuits are designed to transmit to semiconductor-based systems signals to enable operation of such systems only when a common high-potential power rail reaches a certain minimum potential. These power-on reset circuits may be used to enable "hot" or live insertion of systems or subsystems such as circuit boards that are initially unpowered into extended coupled circuitry that is powered. The power-on reset circuitry is supposed to protect the unpowered system or subsystem from significant initial potential variations that may cause damage or unexpected operational anomalies in the circuitry that is inserted into the active system. In effect, the power-on reset circuit is designed to hold off enabling activation of the subsystem until the power rail potential is suitable for activation of that particular subsystem.

A voltage level converter or translator buffer is used to adjust the logic high and logic low voltage levels associated with a single input signal, or a pair of input signals, coming into the buffer to high and low voltage levels compatible with downstream circuitry. The translator buffer must transfer these electrical signals at desired amplitude and rate and, preferably, using as little power as possible. The signal transfer occurs between active devices that are either on the same semiconductor-based chip or on different chips. The devices may be located proximate to one another, or they may be some distance from one another. One example of a proximate device interface requiring one or more bus connections is the coupling of one printed circuit board to another within a computing system, such as through a backplane bus. An example of a remote device interface requiring one or more bus connections is the coupling of one computing system to another.

It is well known that in digital systems the signals moving between devices are categorized as either logic level high (or "1" or "ON") and logic level low (or "0" or "OFF"). The particular signal potential that defines whether a logic high or a logic low is being transmitted is dependent upon the semiconductor components that form the circuitry associated with that transmission. The most common circuit configurations used to produce digital signals include, among others, CMOS, Transistor-Transistor Logic (TTL), and Emitter Coupled Logic (ECL). Each of these logic configurations operates differently as a function of the "swing" between what constitutes a logic high signal and what constitutes a logic low signal.

For CMOS logic systems for example, which is based primarily on the use of slower, less-power-consuming MOS transistors, a logic low signal is generally developed in the range of 0.6 volts (V) above a low-potential power rail GND, which may be at 0.0 V. A logic high signal is generally developed in the range of Vcc to Vcc-0.6 V, where Vcc may vary between 4.5 V and 5.5 V for a nominal 5-volt supply, or between 3.0 V and 3.6 V for a nominal 3.3-volt supply. For the 3.3-volt supply then, the differential swing between low and high must be at least 2.4 volts in order to ensure that a desired shift between a logic low and a logic high will occur. More recently, nominal 2-volt supplies are being used to power eversmaller devices. TTL and ECL logic configurations, on the other hand, are based primarily on the use of faster, high-power-consuming bipolar transistors. The differential swing for a shift between a logic low and a logic high is significantly less than it is for CMOS operation—it may as low as 0.4 volt. In TTL circuitry for example, which is Vcc dependent, a logic high is equivalent to a potential of about Vcc-0.8 V and a logic low is equivalent to a potential of about Vcc-1.9 V. Thus, in mating CMOS and non-CMOS transmissions, it can be seen that variations in potential swings will not automatically ensure the triggering of a desired swing from one logic level to another. Furthermore, minor potential swings in TTL signals, and low voltage TTL (LVTTL) swings in particular, may not effect any logic level change associated with CMOS transistors connected thereto. Alternatively, signal swings that do not reach full CMOS potentials, whether high or low, or that at least do so relatively slowly, can cause both pull-up (P-type MOS) transistor and pull-down (N-type MOS) transistor to be on at the same time. This produces a direct rail-to-rail current flow through the on PMOS and NMOS transistors. This current is known as simultaneous conduction current or leakage current and is an undesirable source of power consumption.

Power-on rest circuits come in a variety of designs. One circuit that has been found to be adequate in prior systems requiring the translation of a reset signal at one potential to a signal at a higher potential is illustrated in a simplified diagram in FIG. 1. The prior reset circuit with translation 10 shown includes a first reset sub-circuit 20 powered by first high-potential power rail Vcca at a first potential, and a second reset sub-circuit 30 powered by a second high-potential power rail Vccb at a second potential higher than the first potential of Vcca. A simple logic-level translator sub-circuit 40 increases the potential associated with reset sub-circuit 20 to that associated with reset sub-circuit 30 to enable appropriate interfacing of the reset sub-circuit 20 with the reset sub-circuit 30 and following circuitry coupled thereto. An exemplar suitable translator sub-circuit is shown in FIG. 2. The translated output signal at output node B is one input to any sort of logic gate capable of controlling the state of the output of circuit 10 including, for example, logic NOR gate NOR. The output of inverter IV4 is the other input to NOR. When potentials of circuits 20 and 30 have exceeded some defined value set, the outputs of 40 and IV4 are both low and the power-on reset signal is activated in that RESET will be a logic high at the potential of Vccb.

With continuing reference to FIG. 1, sub-circuit 20 includes a voltage divider formed of resistors R1 and R2, wherein R1 has a high-potential node coupled to high-potential power rail Vcca and R2 has a low-potential node coupled to a common low-potential power rail GND. Resistor R3 coupled in series with NMOS transistor M1 acts as an inverter, wherein the high-potential node of R3 is coupled to Vcca and its low-potential node is coupled to the drain of M1. M1 has its source coupled to GND and its gate coupled to the output of the voltage divider R1/R2. As the potential of Vcca ramps up, it reaches some level defined by the voltage divider at which the output of inverter R3/M1 flips from a logic high to a logic low. That output signal is twice inverted at full Vcca potential by inverters IV1 and IV2 such that the output of IV2 at node A is the equivalent of a logic low when Vcca reaches full potential. It is to be noted that other switching means may be used as a substitute for transistor Ml, including, for example, a bipolar transistor.

Sub-circuit 30 is similarly configured. Specifically, sub-circuit 30 includes a voltage divider formed of resistors R4 and R5, wherein R4 has a high-potential node coupled to high-potential power rail Vccb at a first potential, and R5 has a low-potential node coupled to GND. Resistor R6 coupled in series with NMOS transistor M2 acts as an inverter, wherein the high-potential node of R6 is coupled to Vccb and its low-potential node is coupled to the drain of M2. M2 has its source coupled to GND and its gate coupled to the output of the voltage divider R4/R5. As the potential of Vccb ramps up, it reaches some level defined by the voltage divider at which the output of inverter R6/M2 flips from a logic high to a logic low. That output signal is twice inverted at full Vccb potential by inverters IV3 and IV4 such that the output of IV4 is the equivalent of a logic low when Vccb reaches full potential. Of course, as with the transistor M1, any sort of switching device may be used to perform the function of transistor M2 including, for example, a bipolar transistor.

The logic-level translator 40 is shown in FIG. 2. It includes inverter IV5 powered by Vcca and GND. The input to IV5 is the output of inverter IV2 from sub-circuit 20 at node A. The translator 40 further includes PMOS transistor M3, and inverters IV6 and IV7. Second high-potential rail Vccb and GND power all three devices. The output of inverter IV5 is the input to IV6 and to IV7. The output of IV6 is coupled to the gate of M3, which has its source coupled to Vccb and its drain coupled to the output of IV5. The translator 40 is designed such that inverter IV7 outputs a logic low signal at node B only when the output of IV5 is high and M3 is on. In order for IV5 to produce a logic high, Vcca must be at a potential high enough to turn on M1 of sub-circuit 20. In order for M3 of translator 40 to be on, the input to IV6 must be high and the potential of Vccb must exceed some threshold value greater than the potential associated with the logic high signal output by IV5. When that occurs, the power supply is deemed to have reached a suitable condition to trigger activation of the RESET signal for coupling to downstream circuitry.

Unfortunately, there exists a problem with the use of the translator sub-circuit 40 shown in FIG. 2 in combination with the reset circuit 10 shown in FIG. 1. Specifically, under the conditions when inverter IV5 produces a logic high signal and Vccb is essentially off and therefore establishes no potential, there is created a leakage path for current to pass from the output of IV5 through turned-on transistor M3 to Vccb. This results in the undesirable development of the leakage current that draws power unnecessarily from the system and reduces operating efficiency. More generally, it is to be noted that translation circuits use power, create signal propagation delays, may not provide full translation, and inherently take up premium circuit space.

Therefore, what is needed is a power-on reset circuit for use with a dualsupply power system wherein the two supplies may be of unequal potential. What is also needed is such a power-on reset circuit without current leakage pathways. Further, what is needed is a power-on reset circuit for the propagation of a supply signal associated with power supplies of uneven potential without requiring a translator circuit to convert logic signals of differing potentials.

SUMMARY OF THE INVENTION

It is an object of the present invention to provide a power-on reset circuit for use with a dual-supply power system wherein the two supplies may be of unequal potential. It is also an object of the present invention to provide such a power-on reset circuit without current leakage pathways. Further, it is an object of the present invention to provide a power-on reset circuit for the propagation of a supply signal associated with power supplies of uneven potential without requiring a translator circuit to convert logic signals of differing potentials.

These and other objectives are achieved in the present invention by eliminating the translator circuit described and re-configuring the coupling of certain components of the reset circuit of FIG. 1. Specifically, the present invention involves establishing a power-on reset circuit that couples only the voltage divider to the first power supply, and all the remaining elements of the reset circuit to the second power supply. In that way, the first power supply is used to trigger activation of a first NOR gate input branch, while the second NOR input branch remains powered by the second power supply. The inverter stages of the prior sub-circuit 20 are now preferably connected to the second power supply in the manner to be described in the Detailed Description section herein.

The modification of the coupling of the various components of the prior reset circuit accomplishes several performance improvements. First, the deficiencies associated with the inclusion of a translator circuit are eliminated with the removal of that circuit. Second, there is no direct current path between the first and second power supplies in that the voltage divider coupled to the first supply is only coupled to the control node of the switching means that is powered by the second supply and so there is no current leakage path. Third, even with the second supply off, the logic signal input associated with the first power supply is irrelevant to the reset operation due to the control of the reset signal by the logic gate. Finally, it is to be noted that the power-on reset circuit of the present invention may be used to define the threshold potential for reset power on in regard to either power supply, as a function of the resistances selected for the particular voltage divider set.

These and other advantages of the present invention will become apparent upon review of the detailed description, the accompanying drawings, and the appended claims.

DESCRIPTION OF THE PREFERRED EMBODIMENT OF THE INVENTION

Figure 1:
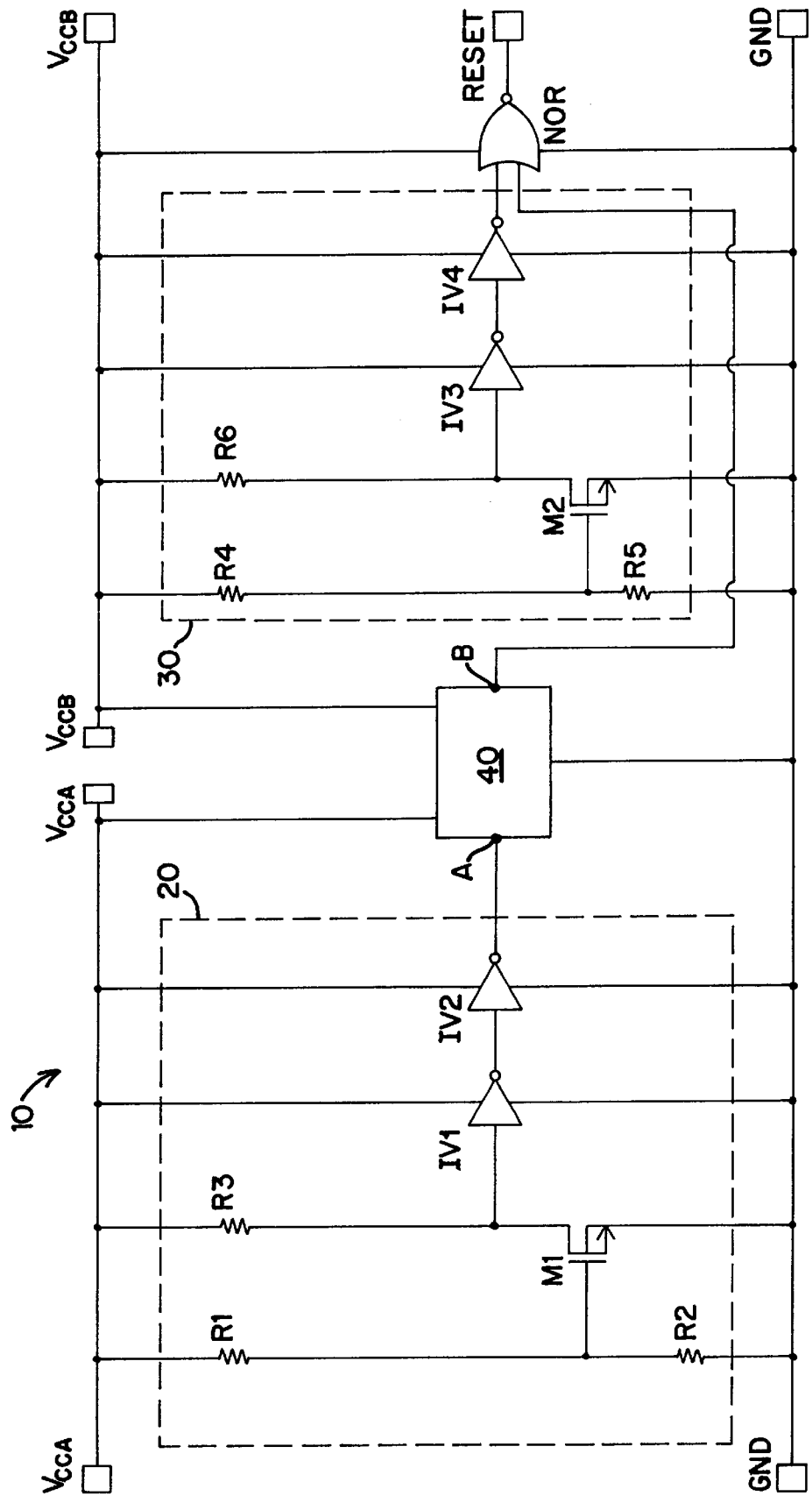
FIG. 1 is a simplified circuit diagram showing a prior-art power-on reset circuit for coupling to a dual-supply system.
Figure 2:
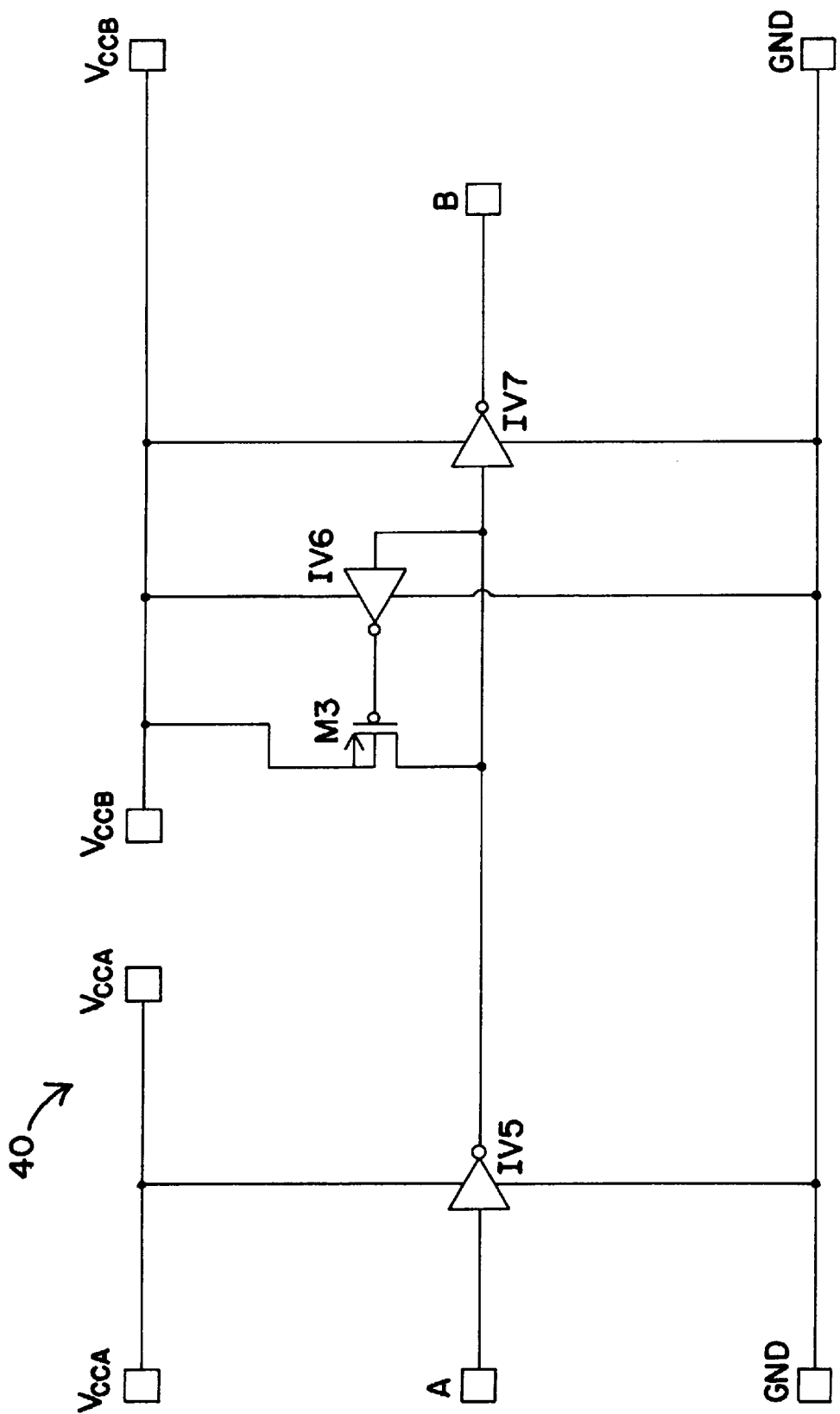
FIG. 2 is a simplified circuit diagram showing a prior-art logic-level translator used as part of the prior-art power-on reset circuit of FIG. 1.
Figure 3:
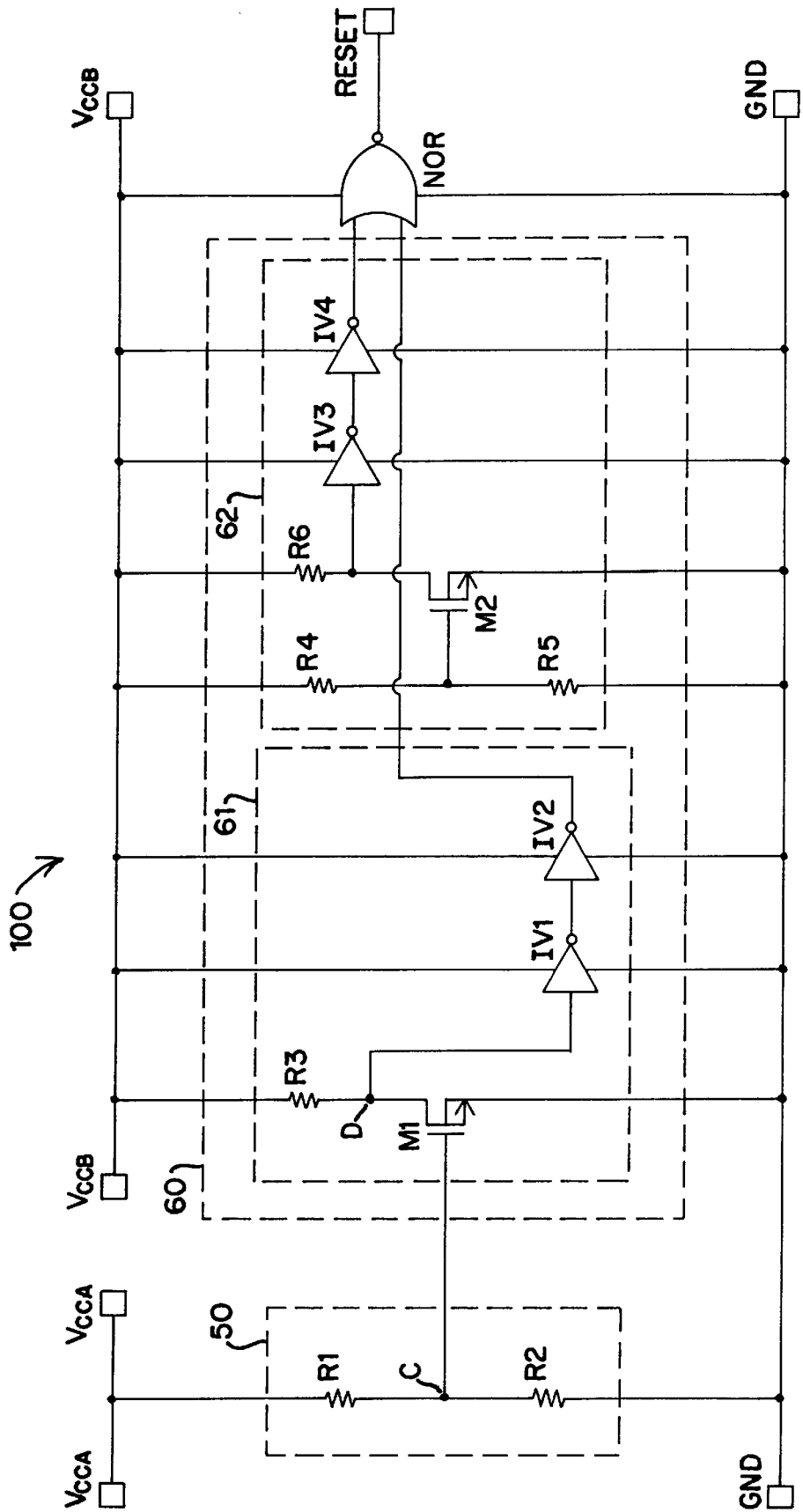
FIG. 3 is a simplified circuit diagram showing the power-on reset circuit for dual supplies of the present invention.

A simplified illustration of a power-on reset circuit 100 of the present invention is shown in FIG. 3. Those components included in the circuit 100 of the present invention that are the same as the components of the prior-art circuit 10 shown in FIG. 1 are designated by like numbers. The reset circuit 100 includes a reset regulating branch 50 powered by first high-potential power rail Vcca of some specified potential. The reset circuit 100 further includes a translation and reset sub-circuit 60 powered by second high-potential power rail Vccb of some specified potential different than that of the potential of rail Vcca. An output of branch 50 is coupled to an input of circuit 60 at node C. Specifically, node C supplies a signal to first-supply-regulated sense circuit 61 so as to regulate an input signal to a logic gate such as NOR gate NOR, or any other suitable logic device capable of evaluating the input signals to produce a selected output signal. A second circuit, second-supply-regulated sense circuit 62 provides a second input to NOR that is regulated by the potential of rail Vccb. When potentials of Vcca and Vccb have exceeded some defined value set, the outputs of 61 and 62 are both low and the power-on reset signal is activated in that RESET will be a logic high at the potential of Vccb.

With continuing reference to FIG. 3, branch 50 includes a voltage divider formed of resistances identified as resistors R1 and R2, wherein R1 has a high-potential node coupled to high-potential power rail Vcca and R2 has a low-potential node coupled to a common low-potential power rail GND. The output of the potential established by branch 50 at node C is defined by the selectable resistances associated with resistances R1 and R2 and the potential of Vcca.

Circuit 61 includes resistor R3 coupled in series with NMOS transistor M1, the combination of which acts as an inverter. The deviation from the prior-art circuit 10 resides in the fact that the gate of M1 is still coupled to node C such that Vcca controls its turn-on, while the potential at its drain is now regulated by the potential of Vccb. Specifically, the high-potential node of R3 is now coupled to Vccb, whereas its low-potential node remains coupled to the drain of M1. M1 has its source coupled to GND. As the potential of Vcca ramps up, it reaches some level defined by branch 50 as indicated at which point the output of inverter R3/M1 flips from a logic high to a logic low through the turn on of M1, but only if there is a relevant potential at the low-potential node of R3 defined by the potential of Vccb. If Vccb is off, M1 cannot operate. The remainder of circuit 61 includes prior inverters IV1 and IV2 now powered by Vccb rather than Vcca. Again, it is to be noted that any suitable sort of switching means may be substituted for the transistor M1 including, for example, a bipolar transistor. It is important that such switching means have a control node coupled to the output of the voltage divider and a current path supplied by the second power supply Vccb.

Circuit 62 remains essentially the same as the prior sub-circuit 30. Specifically, circuit 62 includes a voltage divider formed of resistors R4 and R5, wherein R4 has a high-potential node coupled to high-potential power rail Vccb at a first potential, and R5 has a low-potential node coupled to GND. Resistor R6 coupled in series with NMOS transistor M2 acts as an inverter, wherein the high-potential node of R6 is coupled to Vccb and its low-potential node is coupled to the drain of M2. M2 has its source coupled to GND and its gate coupled to the output of the voltage divider R4/R5. As the potential of Vccb ramps up, it reaches some level defined by the voltage divider at which the output of inverter R6/M2 flips from a logic high to a logic low. That output signal is twice inverted at full Vccb potential by inverters IV3 and IV4 such that the output of IV4 is the equivalent of a logic low when Vccb reaches full potential. Again, transistor M2 is shown to represent a controllable switching means and may alternatively be a bipolar transistor, for example, having a control node and high-potential and low-potential nodes.

In operation, powering up of supply Vcca provides to C a potential equivalent to the potential of Vcca less the drop across R1. When that potential at C reaches a threshold turn-on potential at the gate of M1, that transistor turns on. Turning transistor M1 on establishes a logic low output at node D that is inverted by inverters IV1 and IV2 to provide a logic low to the first input of NOR. With Vccb sufficiently powered up to enable activation of M1, inverter IV4 of circuit 62 supplies a logic low to the second input of NOR, thereby establishing a logic high signal at the output of that gate to initiate the power-on reset signal at RESET.

It is to be noted that the circuit 100 may be modified as desired to define the potentials of Vcca and Vccb at which NOR produces an activation signal by selecting the resistances of the resistors of the two voltage divider sets. It is also to be noted that either of rail Vcca and Vccb may be the higher of the two for purposes of defining the reset activation for given potentials at either rail.

While the invention has been described with reference to particular example embodiments, it is intended to cover all modifications and equivalents within the scope of the following claims.

What is claimed is:

1. A power-on reset circuit powered by a first high-potential power rail, a second high-potential power rail, and a low-potential power rail, wherein the first high-potential power rail is designed to supply a potential different from a potential to be supplied by the second high-potential rail, and wherein the circuit includes a reset output node, the circuit comprising:
   a. a voltage divider branch having a first resistor with a high-potential node coupled to the first high-potential power rail and a second resistor having a high-potential node coupled to a low-potential node of said first resistor and a low-potential node coupled to the low-potential power rail, and an output;
   b. a first reset sub-circuit having a control node coupled to said output of said voltage divider branch, wherein said first rest sub-circuit is coupled to the second high-potential power rail, said first reset sub-circuit having an output coupled to the rest output node; and
   c. a second reset sub-circuit coupled to the second high-potential power rail and having an output coupled to the reset output node,
   wherein a signal of said output of said first reset sub-circuit and a signal of said output of said second reset sub-circuit in combination define a signal at the reset output node.

2. The circuit as claimed in claim 1 wherein said first reset sub-circuit includes an inverter branch comprising a switching means having a control node coupled to said output node of said voltage divider and a low-potential node coupled to the low-potential power rail.

3. The circuit as claimed in claim 2 wherein said switching means is an NMOS transistor.

4. The circuit as claimed in claim 3 wherein said first reset sub-circuit further includes a resistance having a high-potential node coupled to the second high-potential power rail and a low-potential node coupled to a drain of said NMOS transistor of said first reset sub-circuit.

5. The circuit as claimed in claim 4 wherein said first reset sub-circuit further includes a first inverter and a second inverter coupled in series, wherein an input of said first inverter is coupled to said low-potential node of said resistance of said first reset sub-circuit, and wherein an output of said second inverter is coupled to the reset output node.

6. The circuit as claimed in claim 5 wherein said second reset sub-circuit includes a second voltage divider having a first resistance and a second resistance, wherein said first resistance has a high-potential node coupled to the second high-potential power rail and a low-potential node coupled to a high-potential node of said second resistance of said second voltage divider, wherein a low-potential node of said second resistance is coupled to the low-potential power rail, and wherein said low-potential node of said first resistance is an output node of said second voltage divider.

7. The circuit as claimed in claim 6 wherein said second reset sub-circuit includes an inverter branch comprising a second switching means having a control node coupled to said output node of said second voltage divider and a low-potential node coupled to the low-potential power rail.

8. The circuit as claimed in claim 7 wherein said second switching means is an NMOS transistor.

9. The circuit as claimed in claim 8 wherein said second reset sub-circuit further includes a resistance having a high-potential node coupled to the second high-potential power rail and a low-potential node coupled to a drain of said second NMOS transistor of said second reset sub-circuit.

10. The circuit as claimed in claim 9 Wherein said second reset sub-circuit further includes a third inverter and a fourth inverter coupled in series, wherein an input of said third inverter is coupled to said low-potential node of said first resistance of said second voltage divider, and wherein an output of said fourth inverter is coupled to the reset output node.

11. The circuit as claimed in claim 10 further comprising a logic device having a first input node, a second input node, and an output, wherein said first input node is coupled to said output of said second inverter, said second input node is coupled to said output node of said fourth inverter, and wherein said output node is coupled to the reset output node.

12. The circuit as claimed in claim 11 wherein said logic device is a NOR gate.

13. The circuit as claimed in claim 1 wherein the first high-potential power rail is powered at a potential higher than the potential of the second high-potential power rail.

14. The circuit as claimed in claim 1 wherein the second high-potential power rail is powered at a potential higher than the potential of the first high-potential power rail.

* * * * *